US008581412B2

(12) United States Patent
Pilard et al.

(10) Patent No.: US 8,581,412 B2
(45) Date of Patent: Nov. 12, 2013

(54) SEMICONDUCTOR DEVICE COMPRISING AN ELECTROMAGNETIC WAVEGUIDE

(75) Inventors: Romain Pilard, Goncelin (FR); Daniel Gloria, Detrier (FR); Frederic Gianesello, Crolles (FR); Cedric Durand, Saint Martin d'Heres (FR)

(73) Assignee: STMicroelectronics S.A., Montrouge (FR)

( * ) Notice: Subject to any disclaimer, the term of this patent is extended or adjusted under 35 U.S.C. 154(b) by 133 days.

(21) Appl. No.: 12/896,558

(22) Filed: Oct. 1, 2010

(65) Prior Publication Data

US 2011/0084398 A1 Apr. 14, 2011

(30) Foreign Application Priority Data

Oct. 8, 2009 (FR) ..................................... 09 57028

(51) Int. Cl.
*H01L 23/48* (2006.01)

(52) U.S. Cl.
USPC .... 257/774; 257/621; 257/698; 257/E21.476; 257/E23.011

(58) Field of Classification Search
USPC ........... 257/774, E23.011, 621, 698, E21.476
See application file for complete search history.

(56) References Cited

U.S. PATENT DOCUMENTS

| | | | | |
|---|---|---|---|---|
| 5,986,331 | A | 11/1999 | Letavic et al. | |
| 6,518,864 | B1 | 2/2003 | Ito et al. | |
| 6,909,345 | B1 | 6/2005 | Salmela et al. | |
| 2003/0148558 | A1 | 8/2003 | Kubo et al. | |
| 2005/0029632 | A1 * | 2/2005 | McKinzie et al. | 257/665 |
| 2008/0079170 | A1 * | 4/2008 | Pruvost et al. | 257/774 |

FOREIGN PATENT DOCUMENTS

| | | | |
|---|---|---|---|
| EP | 0883328 | A1 | 12/1998 |
| EP | 0942470 | A2 | 9/1999 |
| EP | 1331688 | A1 | 7/2003 |
| EP | 1936741 | A1 | 6/2008 |

OTHER PUBLICATIONS

French Search Report cited in Application No. 0957028, dated May 31, 2010 (3 pages).
Gianesello, F., et al: "State of the Art Integrated Millimeter Wave Passive Components and Circuits in Advanced Thin SOI CMOS Technology on High Resistivity Substrate," IEEE SOI Conference, Hawaii, Oct. 2005.

* cited by examiner

*Primary Examiner* — Lynne Gurley
*Assistant Examiner* — Vernon P Webb
(74) *Attorney, Agent, or Firm* — Gardere Wynne Sewell LLP

(57) ABSTRACT

A semiconductor device includes a substrate. On at least one face of that substrate, integrated circuits are formed. At least one electromagnetic waveguide is also included, that waveguide including two metal plates that are placed on either side of at least one part of the thickness of the substrate and are located facing each other. Two longitudinal walls are placed facing each other and are formed by metal vias made in holes passing through the substrate in its thickness direction. The metal vias electrically connect the two metal plates.

30 Claims, 5 Drawing Sheets

SEMICONDUCTOR DEVICE COMPRISING AN ELECTROMAGNETIC WAVEGUIDE

PRIORITY CLAIM

This application claims priority from French Application for Patent No. 09-57028 filed Oct. 8, 2009, the disclosure of which is hereby incorporated by reference.

TECHNICAL FIELD

The present invention relates to the field of integrated-circuit semiconductor devices.

BACKGROUND

It appears to be particularly advantageous to have such semiconductor devices for transporting signals.

SUMMARY

A semiconductor device is proposed that comprises a substrate on at least one face of which integrated circuits and an electrical connection network are formed.

The semiconductor device may further comprise at least one electromagnetic waveguide comprising two metal plates that are placed on either side of at least one part of the thickness of said substrate and are located facing each other and two longitudinal walls placed facing each other and formed by pluralities of metal vias made in holes passing through the substrate in its thickness direction and extending between said metal plates.

The semiconductor device may further comprise at least one electrode on the substrate, coupled electromagnetically to the electromagnetic waveguide and connected electrically to the integrated circuits by the electrical connection network.

The semiconductor device may further include at least one transverse wall at least at one of the ends of said longitudinal walls, this transverse wall being formed by a plurality of metal vias made in holes passing through the substrate in its thickness direction and extending between said metal plates.

The semiconductor device may further comprise at least one electrode made in a hole of said substrate and connected to at least one electronic component of said integrated circuits through a passage or opening in the metal plate located on the side with the integrated circuits, at a certain distance from the edge of this passage.

At least one of said metal plates may have at least one passage or an opening, said device comprising at least one electrode extending above and at a certain distance from this passage and connected to at least one electronic component of said integrated circuits.

The semiconductor device may further comprise at least one obstacle made in at least one hole of the substrate, this obstacle being placed inside the electromagnetic waveguide.

BRIEF DESCRIPTION OF THE DRAWINGS

Semiconductor devices will now be described by way of non-limiting examples and illustrated by the drawing in which.

DETAILED DESCRIPTION OF THE DRAWINGS

Figure 1:
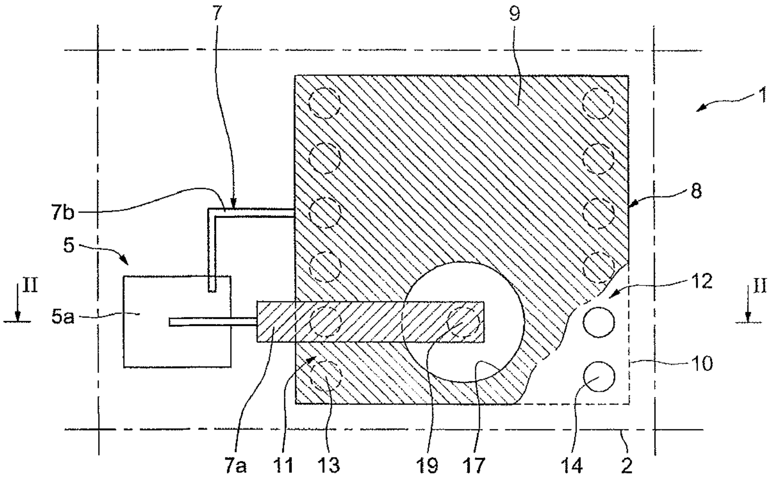
FIG. 1 shows a schematic top view of a semiconductor device.
Figure 2:
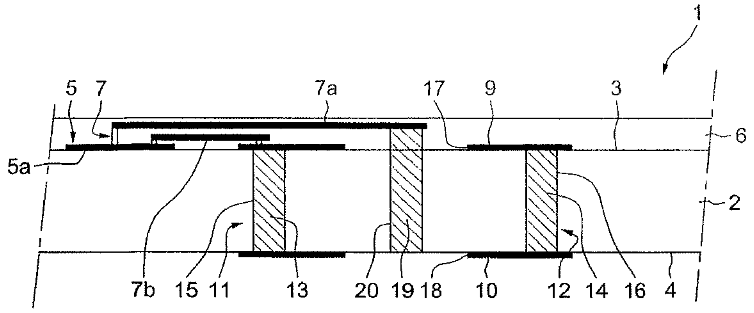
FIG. 2 shows a schematic cross-sectional view on II-II of the semiconductor device of FIG. 1.

A semiconductor device 1 shown in FIGS. 1 and 2 comprises a substrate 2, for example made of silicon, having two opposed faces, namely the front and rear faces 3 and 4.

Integrated circuits 5 and an interconnect layer 6 are formed on the front face 3 of the substrate 2, in which interconnect layer an electrical connection network 7, for example on several metal levels connected by metal vias, is provided.

The device 1 further comprises an electromagnetic waveguide 8.

The structure of the electromagnetic waveguide 8 may comprise two metal plates 9 and 10 formed on either side of the opposed faces 3 and 4 of the substrate 2 and located facing each other. The metal plate 9 may be placed on the face 3 of the substrate 2 or in a metal level of the interconnect layer 6. According to this example, the integrated circuits 5 and the metal plate 9 are on different zones of the front surface 3 of the substrate 2.

The structure of the electromagnetic waveguide 8 may further comprise two longitudinal walls 11 and 12 facing each other and formed by pluralities of metal vias 13 and 14 respectively that are made in and fill holes 15 and 16 passing through the substrate 2 in its thickness direction and at a certain distance from each other. The metal vias 13 and 14 extend between the metal plates 9 and 10, from one metal plate to the other, adjacent to or in the proximity of two opposed edges of these plates.

According to the example shown, the metal vias 13, on the one hand, and the metal vias 14, on the other hand, may be aligned in such a way that the longitudinal walls 11 and 12 that they form are rectilinear. The distance between the metal vias 13 and the distance between the metal vias 14 may be approximately equal to $\lambda/10$. Furthermore, the longitudinal walls 11 and 12 may be parallel, their distance depending on the operating wavelength ($\lambda$), for example a wavelength of 430 microns for operation at 120 gigahertz.

The electromagnetic waveguide 8 therefore is in the form of a corridor.

The metal plates 9 and 10 may have passages or openings 17 and 18 facing one another, for example circular passages or openings.

According to one embodiment, the semiconductor device 1 may further comprise a metal electrode 19 immersed inside the electromagnetic waveguide 8.

This electrode 19 may be formed in a hole 20, for example a cylindrical hole, passing through the substrate 2 in the thickness direction and located in the central part of the opposed passages 17 and 18 of the metal plates 9 and 10, at a distance from the edges of these passages in such a way that the metal electrode 19 is electrically isolated from the electromagnetic waveguide 8.

The electrical connection network 7 comprises means 7_a_ designed to connect the end of the metal electrode 19, located on the face 3 of the substrate 2, to an electronic component 5_a_ of the integrated circuits 5 on the substrate 2.

The electromagnetic waveguide 8 may be electrically isolated or connected to a reference potential of the electronic component **5*a* by suitable means 7*b* of the electrical connection network 7**.

It follows from the foregoing that, with regards to an emitter, the electrode 19 may be capable of generating, in the electromagnetic waveguide 8, electromagnetic waves under the effect of radiofrequency signals coming from the electronic component **5*a* or, in terms of receiver, the electrode 19 may also be capable of receiving electromagnetic waves in the electromagnetic waveguide 8 in order to deliver radiofrequency signals to the electronic component 5*a***.

In one embodiment, the hole 20 that receives the electrode 19 could extend over part of the thickness starting from the face 3 of this substrate, the electrode 20 then being shorter. In this case, the plate 10 provided on the rear face 4 of the substrate 2 could not have the passage 18 and could be a solid plate.

Figure 3:
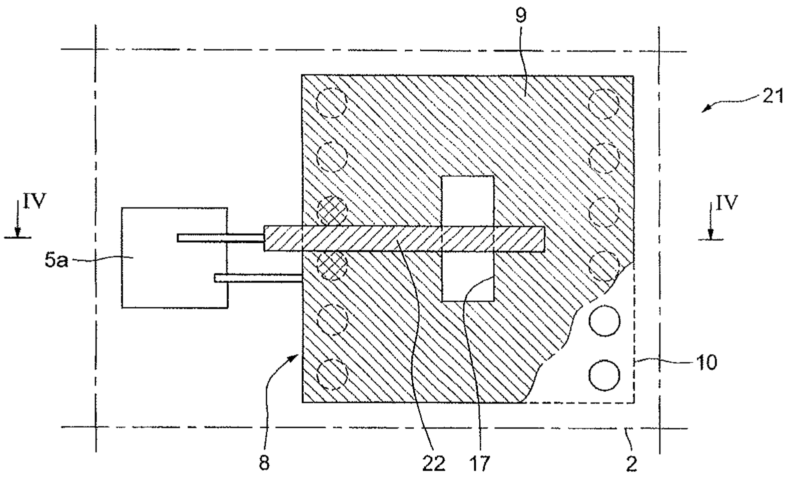
FIG. 3 shows a schematic top view of another semiconductor device.
Figure 4:
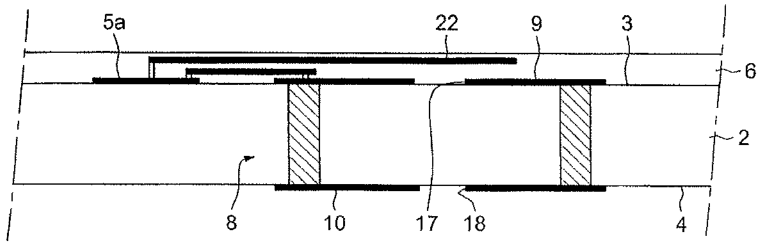
FIG. 4 shows a schematic cross-sectional view on IV-IV of the semiconductor device of FIG. 3.

According to another embodiment, illustrated in FIGS. 3 and 4, a semiconductor device 21 may differ from the semiconductor device 1 described above by the fact that the metal electrode 19 is omitted, the hole 20 no longer existing, and is replaced with a metal electrode 22 made in the form of a strip, in the interconnect layer 6, parallel to the front face 3 of the substrate 2 or to the front plate 9.

This metal electrode 22 may extend above a central part of the passage 17 of the metal plate 9, for example passing from one side of it to the other, and may be connected to the electronic component **5*a*. In this example, the passage or opening 17 in the metal plate 9 is rectangular. The plate 10 may or may not have a passage 18**.

As in the case of the semiconductor device 1, the metal electrode 22, connected to the electronic component **5*a*, may act as electromagnetic wave emitter or as electromagnetic wave receiver in the electromagnetic waveguide 8**.

Figure 5:
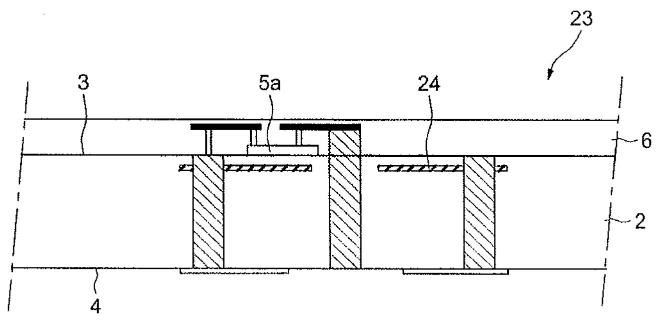
FIG. 5 shows a schematic cross-sectional view of another semiconductor device.

According to another embodiment, illustrated in FIG. 5, a semiconductor device 23 may differ from the semiconductor device 1 by the fact that the metal plate 9 is not made on top of the face 3 of the substrate 2 but is formed by a local layer 24 of the substrate 2, either on the surface or in the depth thereof, resulting from a transformation of the material of this substrate 2. If the substrate 2 is made of silicon this transformation could be obtained by ion implantation, for example phosphorus, boron, arsenic or antimony ion implantation.

Therefore, electronic components of the integrated circuits 5, for example the electronic component **5*a*, could be produced on top of the zone of the local layer 24 that replaces the front plate 9**.

Figure 6:
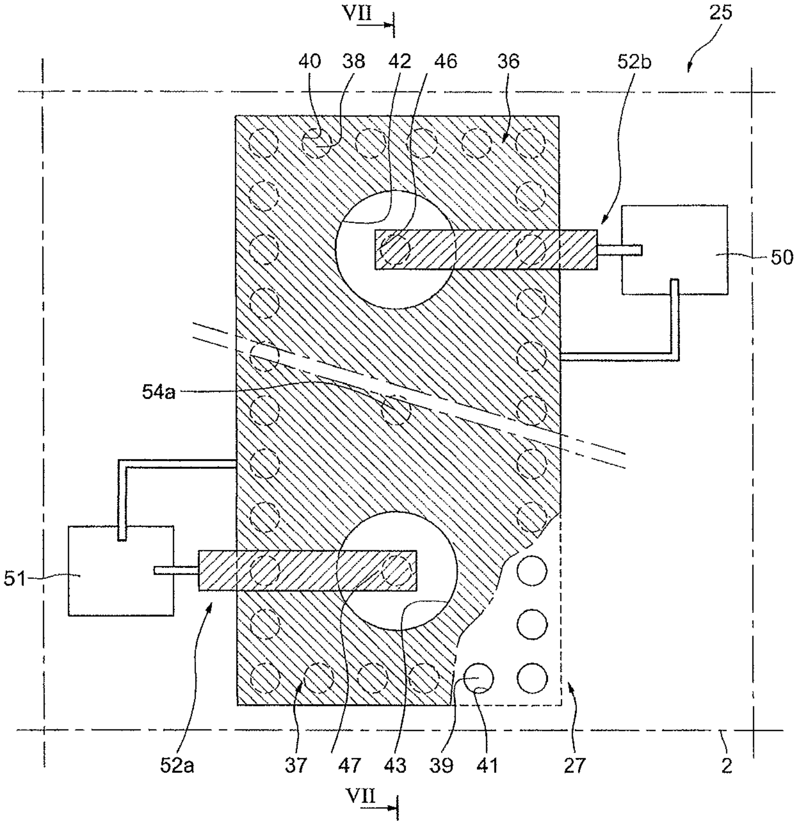
FIG. 6 shows a schematic top view of another semiconductor device.
Figure 7:
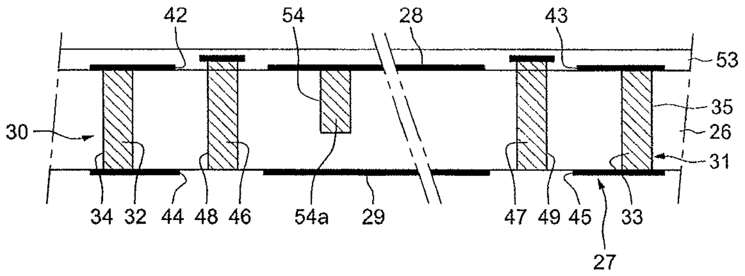
FIG. 7 shows a schematic longitudinal sectional view on VII-VII of the semiconductor device of FIG. 6.

According to another embodiment, illustrated in FIGS. 6 and 7, a semiconductor device 25 also comprises a substrate 26 and an electromagnetic waveguide 27 associated with this substrate 26.

The electromagnetic waveguide 27 also comprises metal plates, namely front and rear plates 28 and 29, which are rectangular and placed on either side of the substrate 26, facing each other, and opposed longitudinal walls 30 and 31 formed by pluralities of metal vias 32 and 33 made through the substrate 26 in through-holes 34 and 35 and located along the longitudinal edges of the front and rear metal plates 28 and 29 and between said metal plates.

According to this example, the electromagnetic waveguide 27 further comprises opposed transverse walls 36 and 37 formed by pluralities of metal vias 38 and 39 made through the substrate 26 in through-holes 40 and 41 and located along the transverse edges of the front and rear metal plates 28 and 29 and between said metal plates.

The electromagnetic waveguide 27 therefore takes the form of an elongated cage.

For example along its longitudinal axis, the front metal plate 28 has passages or openings 42 and 43 spaced apart longitudinally. The rear metal plate 29 may also have passages or openings 44 and 45 placed facing the passages 42 and 43.

The semiconductor device 25 further comprises electrodes 46 and 47 which, according to the example shown, each correspond to the electrode 19 of the example described with reference to FIGS. 1 and 2. The electrodes 46 and 47 are formed in through-holes 48 and 49 of the substrate 26 that are placed in the middle of the passages 42 and 43 of the front plate 28 and in the middle of the passages 44 and 45 of the rear plate 29.

As in the example described with reference to FIGS. 1 and 2, the front ends of the electrodes 46 and 47 are connected to electronic components 50 and 51 respectively of the integrated circuits formed on the front face of the substrate 26 by electrical connection means **52*a* and 52*b* made in a front interconnect layer 53**.

As in the example described with reference to FIGS. 1 and 2, the electrodes 46 and 47, connected to the electronic components 50 and 51 respectively, may act as emitter or as receiver. Thus, when the electrode 46 acts as emitter and the electrode 47 acts as receiver, or vice versa, the electronic components 50 and 51 may exchange signals by means of the electromagnetic waves propagating in the electromagnetic waveguide 27 that carry these signals.

As illustrated in FIG. 7, the substrate 26 of the semiconductor device 25 may furthermore have at least one hole 54, which may or may not be a through-hole, filled with a metallic material **54*a*. This thus forms at least one obstacle capable of filtering or modifying the electromagnetic waves propagating in the electromagnetic waveguide 27** from one electrode to the other. Such obstacles could be provided in all the examples described.

According to one embodiment, the electrodes 46 and 47 could be replaced with the electrode 22 described with reference to FIGS. 3 and 4.

According to another embodiment, illustrated in FIG. 8, a semiconductor device 55 differs from the semiconductor device 1 described with reference to FIGS. 1 and 2 by the fact that the longitudinal walls 56 and 57 of its electromagnetic waveguide 58 have outwardly flaring end parts **56*a* and 57*a* and by the fact that this electromagnetic waveguide 58 has, opposite these flared end parts 56*a* and 57*a*, a transverse wall 59 formed like one of the transverse walls 36 or 37 of the example described with reference to FIGS. 6 and 7**.

The electromagnetic waveguide 58 then takes the form of a longitudinal corridor closed at one of its ends and open at the other.

Figure 8:
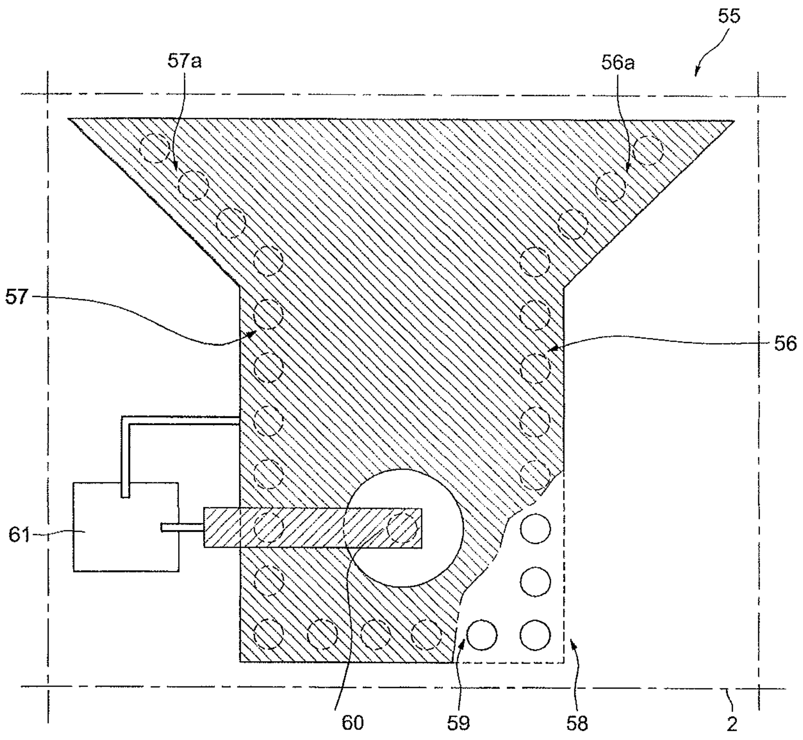
FIG. 8 shows a schematic top view of another semiconductor device.

Thus, an electrode 60 of this semiconductor device 55, which is connected to an electronic component 61, as for example in FIG. 8, may be used as emitter, for emitting electromagnetic waves to the outside through the end opening located at the end of the flared parts **56*a* and 57*a* of the electromagnetic waveguide 58, or as receiver, for receiving the electromagnetic waves entering the electromagnetic waveguide 58**.

The devices as above described have the advantages that the integrated circuits, the connection networks and the electromagnetic waveguides are integrated on a unique substrate. In consequence, the devices are mechanically resistant, the electrical connection are direct and secured and the electrical leakages are minimized.

The present invention is not limited to the examples described above. Many alternative embodiments are possible, in particular by combining the examples described, without departing from the scope defined by the appended claims.

What is claimed is:

1. A semiconductor device, comprising:
a substrate having at least one face supporting integrated circuits;
a connection network formed above the one face;
at least one electromagnetic waveguide, comprising:
two conductive plates positioned facing each other on either side of at least one part of a thickness of said substrate, the integrated circuits and the conductive plate on the one face being located on different regions of the one face; and
two longitudinal walls positioned facing each other and formed by pluralities of metal vias made in holes passing through the substrate in its thickness direction and extending between said conductive plates;
at least one electrode coupled electromagnetically to the electromagnetic waveguide and further coupled electrically to the integrated circuits through the connection network.

2. The device according to claim 1, which further comprises at least one transverse wall positioned at least at one of the ends of said longitudinal walls, this transverse wall being formed by a plurality of metal vias made in holes passing through the substrate in its thickness direction and extending between said conductive plates.

3. The device according to claim 1, wherein the at least one electrode is formed in a hole passing perpendicularly into said substrate, the electrode further passing through an opening formed in one of the conductive plates that is located on the one face to make the electrical connection to the connection network.

4. The device according to claim 1, wherein at least one of said two conductive plates has at least one opening, and wherein the at least one electrode extends above and at a distance from said opening.

5. The device according to claim 1, further comprising at least one obstacle formed in at least one hole of the substrate, this obstacle being located within the electromagnetic waveguide.

6. The device according to claim 1, wherein at least one of the two conductive plates comprises a metal plate.

7. The device according to claim 1, wherein at least one of the two conductive plates comprises a doped region of the substrate.

8. The device according to claim 1, wherein at least one of the two conductive plates has a plan view rectangular shape, and the two longitudinal walls of metal vias are positioned on opposite edges of the rectangular shape.

9. The device according to claim 8, further including at least one transverse wall formed of metal vias extending along at least one other edge of the rectangular shape.

10. The device according to claim 1, wherein at least one of the two conductive plates has a plan view with a rectangular shape with an outwardly flaring end portion, and the two longitudinal walls of metal vias are positioned on opposite edges of the rectangular shape.

11. The device according to claim 10, further including at least one transverse wall formed of metal vias extending along at least one other edge of the rectangular shape.

12. The device according to claim 10, wherein the two longitudinal walls of metal vias are further positioned on opposite edges of the outwardly flaring end portion.

13. The device according to claim 1, wherein the at least one electrode comprises:
a first electrode formed in a first hole passing perpendicularly through said substrate and connected to at least one electronic component of said integrated circuits, the first electrode further passing through a first opening in one of the two conductive plates that is located on the one face to make an electrical connection to the connection network; and
a second electrode formed in a second hole passing perpendicularly through said substrate and connected to at least one electronic component of said integrated circuits, the second electrode further passing through a second opening in one of the two conductive plates that is located on the one face to make the electrical connection to the connection network.

14. The device according to claim 1, wherein the at least one electrode comprises:
a first electrode extending above a first opening in one of the two conductive plates located on the one face; and
a second electrode extending above a second opening in one of the two conductive plates located on the one face.

15. The device according to claim 14, wherein at least one of the first and second electrodes extends to pass completely over the first and second openings, respectively.

16. The device according to claim 1, further comprising at least one obstacle formed in at least one hole of the substrate, this obstacle being located within the electromagnetic waveguide and in electrical connection with at least one of the two conductive plates.

17. The device according to claim 16, wherein the obstacle is a metal post extending parallel to the metal vias.

18. The device according to claim 1, wherein the two conductive plates are configured to have aligned openings therein.

19. The device according to claim 18, wherein the at least one electrode comprises a first electrode extending above said aligned openings.

20. The device according to claim 19, wherein said at least one electrode further comprises an extension of the first electrode extending perpendicularly from the first electrode into the substrate and further extending through at least one of said aligned openings.

21. A semiconductor device, comprising:
a substrate having a front face supporting integrated circuits and a rear face;
a connection network formed above the front face;
at least one electromagnetic waveguide formed in the substrate, comprising:
a first conductive plate positioned on the front face;
a second conductive plate positioned on the rear face in a position opposite the first conductive plate; and
two longitudinal walls, each wall formed by a plurality of metal vias made in holes passing through the substrate between the front face and rear face and in electrical contact with said first and second conductive plates;
at least one electrode extending into the substrate and coupled electromagnetically to the electromagnetic waveguide, said at least one electrode electrically coupled to said integrated circuits through the connection network.

22. A semiconductor device, comprising:
a substrate having a front face and a rear face;
at least one electromagnetic waveguide formed in the substrate, comprising:
a first conductive plate positioned on the front face;

a second conductive plate positioned on the rear face in a position opposite the first conductive plate in a thickness direction of the substrate; and two longitudinal walls, each wall formed by a plurality of metal vias made in holes passing through the thickness of the substrate between the front face and rear face and in electrical contact with said first and second conductive plates.

23. The semiconductor device of claim 21, wherein the plurality of metal vias are positioned in one of either adjacent to and in the proximity of opposed edges of the first and second conductive plates.

24. The semiconductor device of claim 21, wherein the two longitudinal walls form a corridor.

25. The semiconductor device of claim 21, wherein at least one of the first and second conductive plates has at least one electrically isolated opening passing therethrough.

26. The semiconductor device of claim 21, wherein the at least one electrode is positioned within an opening formed in at least one of the first and second conductive plates.

27. The semiconductor device of claim 22, wherein the first conductive plate is formed by ion implantation of the substrate.

28. The semiconductor device of claim 22, wherein an electrical strip is positioned above an opening formed in the first conductive plate.

29. The semiconductor device of claim 22, wherein the least one electromagnetic waveguide is electrically isolated from an electrical component on the substrate.

30. The semiconductor device of claim 22, wherein the first conductive plate is formed in an underderlying layer of the substrate after transformation of the underlying layer.

* * * * *